United States Patent [19]

O'Brien et al.

[11] Patent Number: 4,836,689
[45] Date of Patent: Jun. 6, 1989

[54] ASYMMETRIC PURGE AIR SYSTEM FOR CLEANING A LENS

[75] Inventors: Richard J. O'Brien, Burnsville; Douglas C. Myhre, Eden Prairie, both of Minn.

[73] Assignee: Rosemount Inc., Eden Prairie, Minn.

[21] Appl. No.: 93,475

[22] Filed: Sep. 4, 1987

Related U.S. Application Data

[63] Continuation-in-part of Ser. No. 833,976, Feb. 27, 1986, Pat. No. 4,786,188.

[51] Int. Cl.⁴ .............................................. G01J 05/08
[52] U.S. Cl. ..................................... 374/125; 350/584
[58] Field of Search ................ 374/125, 144; 350/584; 356/43; 250/346, 364

[56] References Cited

U.S. PATENT DOCUMENTS

| | | |
|---|---|---|
| 3,436,965 | 4/1969 | Land . |
| 3,626,758 | 12/1971 | Stewart et al. . |
| 3,846,080 | 11/1974 | MacLean et al. . |
| 3,861,198 | 1/1975 | Shea . |
| 3,877,780 | 4/1975 | Taylor . |
| 4,018,513 | 4/1977 | Boeke . |
| 4,037,473 | 7/1977 | Compton et al. . |
| 4,118,985 | 10/1978 | Compton . |
| 4,306,835 | 12/1981 | Hurley . |
| 4,435,093 | 3/1984 | Krause et al. . |
| 4,459,043 | 7/1984 | Luke . |

FOREIGN PATENT DOCUMENTS

| | | |
|---|---|---|
| 7728335 | 9/1977 | France . |
| 584195 | 1/1978 | U.S.S.R. . |
| 1559185 | 2/1978 | United Kingdom . |
| 2130717 | 2/1983 | United Kingdom . |

OTHER PUBLICATIONS

"WO 87/05390, published Sep. 11, 1987, (G01J 05/08, Purgeair System for a Combustion Instrument", Rosemount Inc., (Myhre et al.).

Swithenbank, J., "Technical Evaluation Report Session III—Pyrometry", from *AGARD Conference Procedings No. 399; Advanced Instrumentation for AeroEngine Components*, May, 1986.

*Primary Examiner*—Daniel M. Yasich
*Attorney, Agent, or Firm*—Kinney & Lange

[57] ABSTRACT

A purging air flow system for passing air over a lens to keep it clean and free from particulate contaminants and also for providing a positive flow of air away from the lens has baffles which cause a flow across the lens that is not symmetrical to avoid a dead air or stagnation zone in the center of the lens. The air supply used for such purging is controlled adequately so the flow changes direction and particles are removed from the main flow of purge air by inertial separation prior to the time the air contacts the lens. Such air entrained particles might otherwise deposit on the lens. A flow control orifice also may provide a secondary flow to carry the particles separated from the main flow out of the flow passageway.

9 Claims, 2 Drawing Sheets

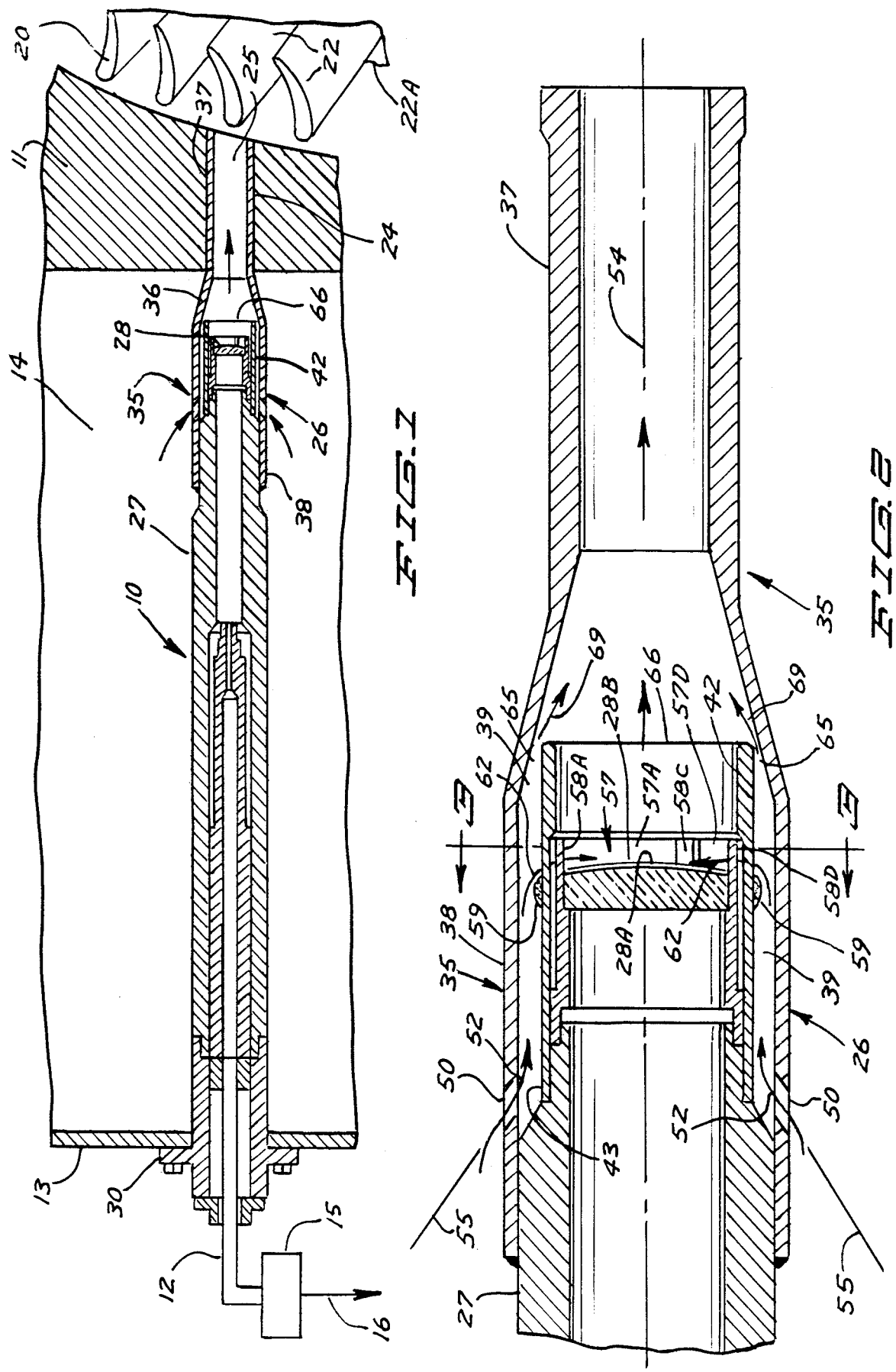

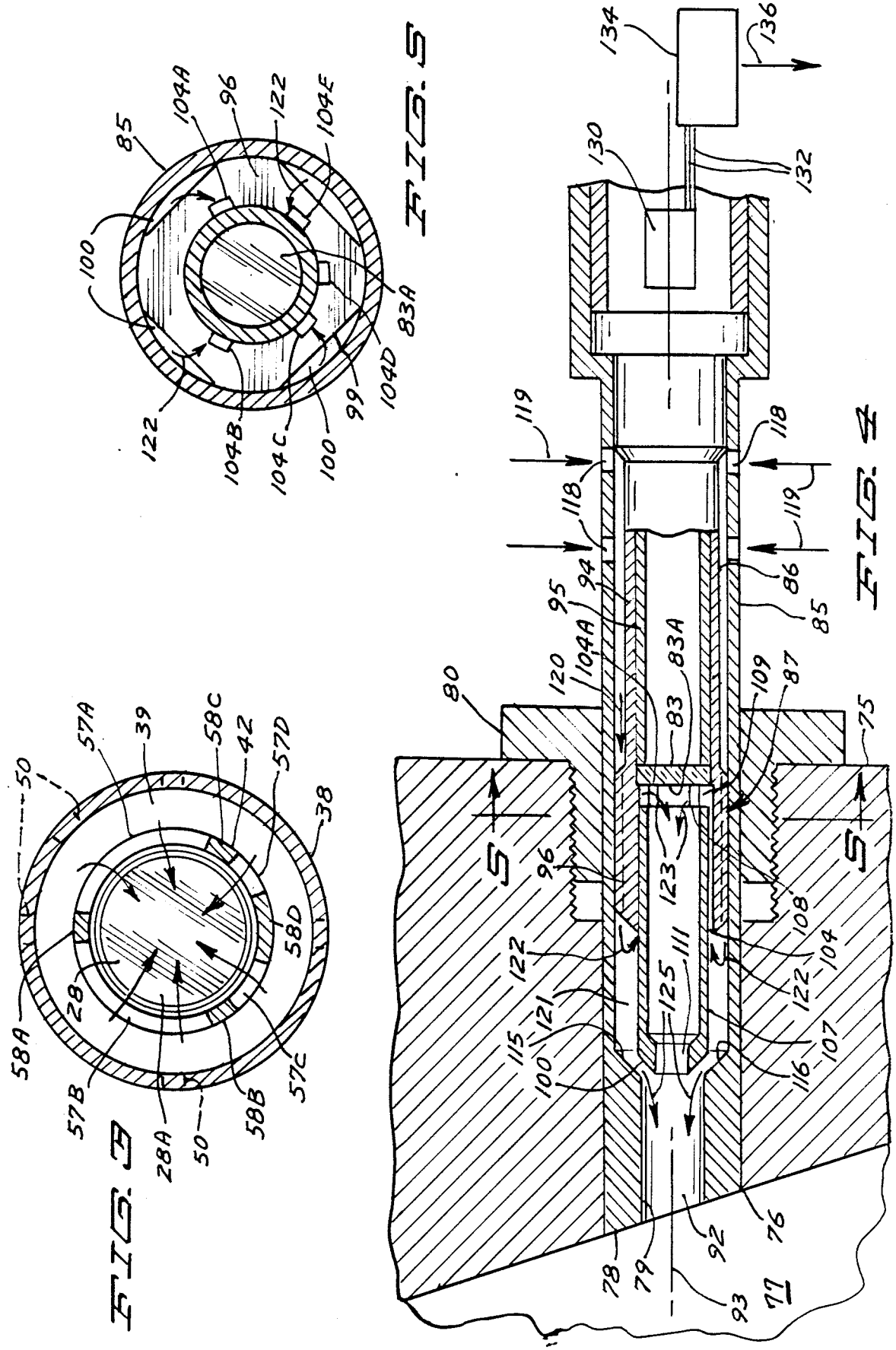

ASYMMETRIC PURGE AIR SYSTEM FOR CLEANING A LENS

CROSS-REFERENCE TO RELATED APPLICATION

This application is a continuation-in-part of copending U.S. patent application Ser. No. 833,976, filed Feb. 27, 1986, now U.S. Pat. No. 4,786,188 for PURGE AIR SYSTEM FOR COMBUSTION INSTRUMENT".

BACKGROUND OF THE INVENTION

1. Field of the Invention

The present invention relates to a system for purging contaminants from the lens of an instrument, such as a radiation pyrometer.

2. Description of the Prior Art

Radiation pyrometers are widely used for detecting temperatures in applications such as gas turbines, and the standard pyrometers sense radiation through a window or lens that is normally mounted in a tube that opens through a housing into a turbine rotor chamber.

One of the requirements is that the pyrometer lens be kept clean and free of particulate contaminants. Particles deposited on the lens can reduce the energy to the sensor and thereby cause inaccurate temperature measurements. Several purge air designs have been developed to keep particulate contaminants from the lens and the sighting tube, but most have limitations in normal use, for example when the pyrometers are to be mounted with the sighting tube facing in an upward direction where gravity will cause particles to fall down onto the lens and the flow is not sufficient to purge the particles. In some designs, a particle laden compressor air supply is used to "scrub" the surface of the lens, that is, pass over the surface of the lens. Significant particle deposition on the lens occurs as the result of the contaminants from the purge air flow contacting and adhering to the lens as the air passes over the surface.

Other designs provide an air curtain spaced from the lens that is intended to keep the flow of air in a direction to move the particles away from the lens, but during starting and stopping of the turbine in an aircraft, particularly when the pyrometer lens surface is facing upwardly, particles precipitate and accumulate on the lens surface.

SUMMARY OF THE INVENTION

The present invention relates to a purge air system for passing a flow of fluid over a window of a combustion instrument to keep it clean and free from particulate contaminants which affect the radiation transmissive characteristics of the window, by providing an asymmetric flow of purge air across the lens to avoid creation of a dead zone or stagnation zone in the center of the lens where particles could come to rest. The present asymmetric flow system is useful with any purge system but preferably the fluid supply used for such purging is controlled adequately to first remove particles from the purge air which might otherwise affect the lens prior to the time the air or fluid is passed over the lens. The purge air also is controlled to maintain an adequate flow velocity to insure that particles that are removed from the lens remain entrained and are carried outwardly away from the pyrometer lens.

In the present invention, compressor air in a jet engine is used for purging. At least the heavier particles carried by the compressor air supply are separated out of the purge air by causing a change in direction of airflow immediately prior to its passage over the lens and by preventing stagnation zones from forming on the lens or window by having an asymmetrical flow pattern radially inward from the outer edge of the lens. The separation eliminates that source of contamination that is present, usually during ground engine operations, when ambient air (used in the compressor) can carry dust particles and other particles. The asymmetrical flow pattern causes a shifting of any flow stagnation point on the lens surface so that substantially no location on the lens tends to collect particles because the purge air moves or flows across the entire surface.

When small particles such as particles formed of an organic material with an adhesive surface come to rest on a pyrometer lens surface they will tend to be firmly attached to the lens by adhesion forces between the particles and the lens. The present device provides for a moving air flow that can be controlled so that an adequate air velocity passes across the lens to reentrain deposited particles and prevent stagnation zones where the smaller particles may tend to collect. Many factors are involved in the adhesion forces, and whether or not a particle adheres to the lens, depends on particle size, particle bounce or rebound energy, and the surface properties of a particle and a lens. The air velocity in the sight tube that is provided by the purging system and the absence of stagnation or dead air zones also overcomes the adherence of the particles.

The present invention serves to insure that the purge air that is used has gone through an inertial separation step so larger particles such as molten solid particles that may fuse to the lens upon contact are separated prior to passing over the lens. It is found that it is very difficult to reentrain submicron particles. The shifting of the flow pattern across the lens without causing a dead zone of no flow reduces the likelihood of such submicron particles being ejected out of the flow. Removal of large particles from the purge air greatly aids in keeping the lens free from deposits.

The present system provides a simple mechanical arrangement for scrubbing the lens or window to control the amount of flow of compressor air past the pyrometer lens to purge the lens and reentrain particles that may have been deposited as well as maintaining a positive pressure in the sight tube to avoid depositing particles. The purge air changes direction significantly just prior to passage over the lens, for inertial separation of larger particles, and the asymmetrical flow causes a shifting of air flow across the entire lens to prevent dead air zones where particles tend to accumulate.

BRIEF DESCRIPTION OF THE DRAWINGS

FIG. 1 is a fragmentary vertical sectional view through a portion of a typical turbine compressor, and showing a sectional view of a radiation pyrometer having a purge system made according to the present invention installed thereon;

FIG. 2 is an enlarged vertical sectional view of the sight tube portion and pyrometer lens of the device shown in FIG. 1;

FIG. 3 is a sectional view taken generally along line 3—3 in FIG. 2;

FIG. 4 is an enlarged vertical sectional view of a modified form of the invention; and FIG. 5 is a sectional view taken on line 5—5 in FIG. 4.

DETAILED DESCRIPTION OF THE PREFERRED EMBODIMENTS

A typical radiation pyrometer indicated generally at 10 is adapted to be mounted in a gas turbine, as in a jet engine, including a turbine housing 11, and an outer shell or wall 13, which together define a compressor bypass passageway indicated at 14 that receives air under pressure from the inlet compressor (before combustion) and is filled, therefore, with air at a pressure above atmospheric pressure, and above that of a combustion suspension which is within the turbine chamber indicated generally at 20 on the interior of the housing or case 11.

Turbine blades schematically indicated at 22 are mounted on a suitable rotor 22A. The temperature of the turbine blades 22 is to be measured by the pyrometer 10 in order to insure that the design operating temperatures are not exceeded, but yet to permit the turbine to operate at or near its most efficient operating temperature or another desired temperature.

The case 11 has a port indicated generally at 25 opening to a passageway 24 in the case 11 which houses a sight tube assembly 26. The sight tube assembly 26 is made to support the pyrometer barrel 27 in a suitable location, so that the pyrometer lens indicated at 28 is positioned axially centered on the axis of the sight tube assembly 26 and in position to receive radiation from the turbine blades 22 through the port 25. Sight tube 26 fits slidingly in passageway 24 to allow for movement due to thermal expansion and contraction between case 11 and wall 13.

The opposite end of the pyrometer 10 has a flange 30 that is mounted to wall 13 in a desired manner. The pyrometer 10 includes optical fiber cable 12 which receives radiation from the turbine blades 22 which passes through the lens 28. The optical fiber cable 12 is of conventional design and conveys the radiation to radiation sensing means 15, which senses the radiation conventionally, such as with silicon photodiodes and optical filters, and produces an output 16 indicative of the temperature of the turbine blades. The diameters of the window or lens 29 and barrel 27 are determined by the requirements of the optical fiber cable 12 and the spacing between the end of the cable and the turbine blade in a conventional manner.

The problems that have been outlined in relation to the depositing of materials on the pyrometer lens are present in most pyrometer systems where a lens or radiation transparent window is open through an open port into a turbine chamber. Any deposits on the lens or window degrades the pyrometer performance and attenuates the radiation signals being received, and thus makes the temperature indications less reliable. In the first form of the invention shown in FIGS. 1, 2 and 3, it can be seen that in order to supply purge air, a series of passageways are provided for permitting air from the chamber 14, which is under pressure, to pass across or purge the lens 28 of particulate contaminants. The sight tube assembly 26 includes an outer conduit or tube member 25 that has a tapered transition section 36 extending from a barrel portion 37 (which fits into passageway 24) to a pyrometer receiving sleeve 38 of larger diameter than the barrel 37. The tube 35 defines an annular passageway indicated at 39 between the interior of the sleeve 38 and a second smaller sleeve 42, which is concentric with the sight tube assembly 26 and fits around an annular surface 43 of the pyrometer barrel 27. Sleeve 42 is fixed in place and forms a flow control sleeve for controlling and directing purge air flow. The lens 28 of the pyrometer is of an ordinary design, and it closely fits within the interior of the sleeve 42. The structure of pyrometer 10 including the sight tube assembly 26 concentric about sleeve 42 provides a rugged, vibration-resistant passageway for purge air flow.

The passageway 39 is an annular passageway, as shown in FIG. 3. A plurality of air inlet openings indicated at 50 are provided in the sleeve 38 of the tube 35. These openings 50 are spaced around the periphery to carry pressurized compressor air present in the chamber 14 into the passageway 39. As seen in FIG. 2, the openings 50 have axes 55 that are inclined relative to the longitudinal axis 54 of the sight tube assembly 26 to create direction change and turbulance as the air enters passageway 39. Particles present in the compressor air entering openings 50 may be found to impact on an outer surface of sleeve 42. Some of these particles may be deflected off the outer surface of sleeve 42 and carried with the purge air flow along passageway 39. Other particles, such as small particles formed of organic material having surfaces with adhesive properties may adhere to the outer surface of sleeve 42. The particles adhered to the outer surface of sleeve 42 can adhere together and agglomerate into a larger particle which is later scrubbed off by the purge air flow and carried by the purge air flow along passageway 39. The compressor pressure at openings 50 is greater than that in the turbine chamber 20, and thus there will be flow in passageway 39 as indicated by the arrows 52 parallel to the longitudinal axis 54. The flow control sleeve 42 has a plurality of openings 57 (as shown in FIG. 2) through the wall thereof that are in transverse alignment with the surface 28A of the lens 28. The openings 57 are large and cause air in passageway 39 to flow into the interior passageway 42A of sleeve 42 and out to the interior of tube 26 forming a passageway for flow to port 25.

The abrupt change in direction of air flow, as it enters the internal passageway 42A of sleeve 42 through openings shown generally at 57, as indicated by the arrows 62 causes inertial particle separation. The heavier particles, such as those larger than a few microns, suspended in the air flowing in passageway 39 will tend to be separated out of the air flow before the flow enters the interior 42A of the sleeve 42. The flow through openings 57 moves past lens 28 and in particular across the lens surface 28A. The smaller particles, such as particles smaller than a few microns, that move past the lens 28 tend to remain entrained in the air flow and are not effectively deposited on the lens. The smaller particles have insufficient momentum to penetrate a boundary layer 28B of purge air formed at the lens surface 28A.

The outer surface of sleeve 42 can be cylindrical along its length as shown in FIG. 1, but inertial particle separation and the flow through openings 57 can be further enhanced by shaping the outer surface of sleeve 42 with a shaped annular surface 59 as shown in FIG. 2. Optional shaped surface 59 has an airfoil cross section which provides a desired reaction force in the moving purge air which induces a large flow through openings 57.

As the air flow represented by the arrows 62 flows across the surface 28A of the lens 28 (or radiation window), it tends to scrub the surface 28A with relatively clean air because the larger particles (such as molten metal particles, dirt, etc.) are separated out by inertial separation caused by the sharp turn in direction of air flow at openings 57. This flow across the lens also tends to reentrain particles already deposited on the lens. The positive flow due to the pressure difference between chambers 14 and 20 keeps particles that are within the interior chamber 42A of sleeve 42 moving and carries the particles out through the internal passageway in direction along the axis 54 toward the port 25. The sleeve 42 forms part of the flow conduit for air flow from the lens 28 to port 25. However, with symmetrical radial inward flow, there is a stagnation zone likely to form near the axis 54. There is essentially no flow at this spot on the lens, so particles can precipitate and deposit on the lens.

The improvement shown herein is the control of flow through the openings 57 to prevent stagnation zones from forming on the center of the lens or window surface. As can be seen in FIG. 3, the openings 57 are made so that they are not symmetrical with respect to the central axis 54 of the lens 28. The openings 57 at the periphery of the lens or window comprise two large openings or ports 57A and 57B, as can be seen in FIG. 3, separated by a support web 58A. The openings 57A and 57B have central radial axes that are symmetrical with respect to a bisecting plane of the support web 58A.

Additional purge flow openings or ports 57C and 57D are separated from the openings 57A and 57B by support webs 58A and 58C, and the openings 57C and 57D in turn are separated by a support web 58D. The positioning of the support webs is such that the radial inward air flow from each opening is not opposed by an equal size opening directly opposite from it, but rather the openings are asymmetrical. In other words, the axes normal to the tangent plane at the center of each opening (bisecting axes) of some of the peripheral openings are not a common axis with another opening on the opposite side of the lens or window. Thus, flow from at least one of the openings or ports does not have a diametrically opposing flow, thus insuring a flow across the center of the lens. When the flows are balanced, a central stagnation region is caused where the opposing flows merge. The asymmetrical flow causes a shifting, turbulent flow rather than a dead air space in the center which occurs when balanced radial flows are present.

The purge air flow therefore is off center, and part of the air will tend to scrub across axis 54 rather than stagnate in the center, to insure that there is adequate movement for removing and keeping particles entrained. The pressure changes occuring keep the region of minimum flow on the lens shifting.

The openings can be made as asymmetric as possible. In general the openings are positioned such that the flows will change direction and shift across the surface of the lens without causing a stagnation point, to scrub off particles and to keep suspended particles from being deposited.

The openings 57A and 57B are quite large, as can be seen, while the openings 57C and 57D are smaller. That generally will mean that there is a different air velocity flow through the openings 57C and 57D than that through openings 57A and 57B. Openings 57A and 57B further aid in shifting low flow regions across the surface of the lens. The flow is not stable but forms a pattern which is unstable and tends to shift and move across the entire surface of the lens or window.

The total flow from openings 50 into openings 57 is controlled by an annular flow control and restriction orifice indicated generally at 65 formed between the inner surface of the transition portion 36 of the outer end 66 of the sleeve 42. The annular control and restriction orifice 65 causes a minor flow indicated by the arrows 69 from passageway 39 past the end surface 66 of the sleeve 42 into the transition section 36 where the flow will join with the flow represented by the arrows 62 from the interior passageway 42A of the sleeve 42. The size of flow control orifice 65 is set to a desired dimension by placing a removable shim over the end of sleeve 42 and then sliding tube assembly 26 back over pyrometer barrel 27 until the tapered section 36 contacts the skin. The tube assembly 26 is then welded to pyrometer barrel 27 and the shim is removed. The total flow then goes through the center portion of the outer barrel 37 outwardly into the turbine chamber through the port 25. The minor flow through the flow control orifice will carry particles separated by the inertial action of changing direction of the air as it enters through openings 57 on out through the passageway 39. These particles are carried through the narrowing end of passageway 39 (where air velocity increases) and into the transition section 36, which also is a constricting section causing greater air velocity. The particles will be carried out and away from the lens 28. The velocity of the purge air flow increases through transition section 36, thus minimizing back flow in transition section 36 and barrel 37 which would otherwise draw suspended combustion particles from turbine chamber 20 into the tube assembly 26. The converging section 36 functions as an aerodynamically shaped nozzle which minimizes back flow and contamination of barrel 37 with combustion particles.

The particulate contaminants that are present in the compressor air, such as molten metal particles, oil mist and the like, are separated out before the flow goes past the lens. The inertial separation insures that the lens is kept clean and purged adequately in use.

The flow of purge air out of port 25 into turbine chamber 20 forces combustion gases and particles in turbine chamber 20 away from port 25, thus minimizing contamination of lens surface 28A by combustion particles. The flow of purge air through the pyrometer 10 also cools pyrometer 10 to extend the use of the pyrometer in the high temperature environment in case 11.

A second form of the present invention is shown in FIGS. 4 and 5, and incorporates the principle of inertial separation by change of direction of the air, as well as asymmetrical purge air flow across a radiation window or lens. As shown in FIG. 4, a turbine housing 75 has a port 76 leading into a rotor chamber 77, and a sight tube assembly 78 is provided in a passageway 79 that opens to the port 76. In this form of the invention, as shown schematically, a gland or unit 80 is used for holding the sight tube assembly 78 in position in the housing 75. The sight tube assembly 78 is adapted so that it will mount a standard radiation pyrometer 82 in position as previously explained. The pyrometer 82 has window or lens 83 at its end to receive radiation from turbine blades (not shown) which pass in front of the port 76.

The pyrometer system also includes a radiation sensor 130 which is disposed to receive the radiation entering the pyrometer along axis 93 and passing through lens 83. Radiation sensor 130 is of conventional design and may include photodiodes and optical filters. Leads 132 couple signals from sensor 130 to processor 134 which calculates an output 136 indicative of a temperature in chamber 77.

In this form of the invention, the sight tube assembly includes a tube or barrel 85, which has a first interior annular passageway shown at 86 formed around a flow control guide sleeve assembly 87 which is positioned in conduit or barrel 85. The passageway 86 opens into a smaller diameter passageway 92 that in turn opens into the chamber 77, and the axis of the sleeve, indicated at 93, is parallel to the axis of the passageway 79. The flow control sleeve assembly 87 includes an outer tube 94 that receives an end portion 95 of the pyrometer assembly 82 to hold it centered on the axis 93.

The tube 94 in turn is made with a locating hub 96 that, as shown in FIG. 5, is made to fit within the passageway 86 of the tube 85, but the outer surface of hub 94 is trimmed off with chordal planes or cuts indicated at 99 to provide axial flow passageways 100 along the interior of the passageway 86 toward the outlet passageway 92. As shown in FIG. 5 there are four such passageways 100 defined. The outer surface of the hub portion 96 is used for locating and positioning tube 94 in proper location.

Also, as shown in FIG. 4, the inner surface of the hub portion 96 is provided with a plurality of axially extending slots or passageways indicated at 104. The interior surface of hub 94 is cylindrical and receives and supports a further purge air flow control exhaust tube 107 which is axially aligned and concentric with the axis 93. The flow control tube 107 has an inlet end 108 spaced downstream from the outer surface 83A of the lens 83 by a gap 109. Flow control tube 107 has an interior exhaust passageway, and at its outer end has a tapered outer flow control surface 110. An exhaust port 111, which is of smaller diameter than the rest of the passageway defined by the tube 107 is provided at the outer end of flow control tube 107. The flow control surface 110 cooperates with an annular inwardly extending shoulder 115 formed at the outer end of chamber 121 in barrel 85. The inner edge of shoulder 115 and surface 110 define an annular outlet flow control orifice 116.

The barrel 85 has lateral facing inlet openings 118 at its outer end, and these passageways 118 are open to the compressor bypass chamber of the turbine, so that air under pressure is admitted as indicated by the arrows 119, into the passageway 86. Because the pressure in the compressor bypass chamber in which the openings 118 are located is higher than the pressure in chamber 77, air will flow along the passageway 86 as indicated by arrows 120. This air will flow through the passageways 100 (see FIG. 5) along portions of the hub 96 into the interior chamber 121. Chamber 121 is defined between the flow control tube 107 and the interior of the barrel 85. The annular outlet flow control orifice 116 tends to restrict the flow of air out through this chamber 121 to the outlet passageway 92. Thus the air flowing from passageway 86 through passageways 100 will be caused to flow through the axial passageways 104 toward edge 108 which defines gap 109 surrounding the lens surface 83A. The arrows 122 illustrate the 180 degrees change of direction of flow required as the purge air flows from passageways 100 into passageways 104. The passageways 104 shown in FIG. 4 end in openings or ports 104A and 104B shown in FIG. 5 which are positioned on opposite sides of a radial plane on which FIG. 4 is taken, and there are passageways forming ports 104C, 104D, and 104E, that are formed to direct the flow of air from passageways 104 radially toward the lens or window 83. The ends of the passageways 104 form the inwardly facing ports or openings 104A-104E at the periphery of the lens or window. The flow through passageways 104 moves through opening 109, past the end 108 of the tube 107 and is thus directed inwardly across the lens or window surface 83A. The flow then moves out through the center of tube 107. The ports 104C, 104D, and 104E are not symmetrical about the central axis 93 and the bisecting axes of these openings do not coincide with the axes of a directly opposite opening.

The flow tube 107 closes off the inner surfaces of the passageways 104. The inlet end 108 of flow control tube 107 as stated is spaced downstream from the outer surface 83A of the lens or window 83 and the opening 109 defines the axial length of ports 104A-104E. The interior passageway of the tube 107 forms an exhaust passageway that carries flow from the openings or ports 104A-104E across the opening or gap 109. The purge air exhausts through the ports 104A-104E to form a radial purge flow adjacent the window or lens 83, in asymmetrical configuration, so that the air flow is not completely balanced and does not center or stagnate with respect to the central axis 93 of the window or lens 83. The ports 104A-104E form purge means that provide an unstable flow of the purge fluid onto the lens surface 83A, so that the flow will not stagnate in any one region on the surface, but will be unstable, and flow from at least one of the ports will scrub across axis 93 to insure that the particles are carried out through the inner passageway of the tube 107.

The asymmetrical flow from the periphery onto the lens shows that the purge means can be made to provide flow that is sufficiently unbalanced or unstable to keep a stagnation zone from forming. The percentage of unstable or unbalanced flow can be varied, depending on pressure and the opening sizes. The ports are made so that there is a substantial magnitude of flow of fluid across the central axis region adjacent to the central axis of the window or lens. The asymmetric flow provides for a circulating or moving zone of lowest flow speed so that all of the surface area of the window or lens that is being purged will be covered with some flow of air in a cycle to insure that particles are kept moving.

As shown, the bisecting axis of at least one of the plurality of peripheral openings has a radial bisecting axis that does not coincide with the axis of another window on an opposite side of the lens.

As stated, the larger particles which are in the chamber 121 are carried by the secondary flow out past the tapered surface 110 and through the orifice 116 into the passageway 92, as indicated by the arrows 125. The purge air that has scrubbed lens surface 83A flows out opening 111 and join the flow coming through orifice 116. The particles that remain entrained are carried with the airstream into the chamber 77. The window or lens surface 83A is purged with air that has been subjected to inertial separation so large particles carried by the purge air are removed.

In both forms of the invention, inertial separation of particles from the compressor air flow is achieved by causing an abrupt change in air flow direction of at least substantially 90 degrees to separate out larger particles shortly prior to passage of the asymmetric flow of air across the pyrometer lens or window. The inertial separation minimizes potential contamination caused by the purge air and the asymmetrical flow insures that all regions of the pyrometer window or lens are kept free of particles.

The pyrometer disclosed herein provides a more reliable measure of a turbine blade temperature and thus allows a turbine engine to be operated at a higher power level at which the turbine blade temperature approaches a selected design temperature for the turbine blades.

While the invention has been shown and described for use on a pyrometer, uses on other combustion instruments which make radiation measurements in a contaminated atmosphere such as a combustion suspension will be apparent to those skilled in the art. The purge air system described herein may be used, for example, on a light-off detector which optically senses the presence of flame in a turbine engine or afterburner. The purge air system described herein may also be used on optical sensing systems for sensing the clearance between a turbine rotor tip and a turbine housing, or an optical system for sensing rotor speed. The present invention may also be used in radiation transmission meters for use in power plant smokestacks or diesel engine exhausts.

What is claimed is:

1. An instrument for sensing radiation representative of a parameter in a particle suspension and for providing an output indicative of the parameter, the instrument receiving a supply of pressurized fluid, comprising:
   port means disposed on the instrument and opening to the parameter source for receiving the radiation;
   sensing means coupled to the port means for sensing the received radiation and for providing the output;
   window means disposed between the port means and the sensing means for transmitting the radiation therethrough and for shielding the sensing means from the particle suspension, the window means having a window surface with a central axis normal to the window surface, for transmitting radiation to the sensing means exposed to the suspension; and
   purge means disposed in the instrument for receiving the pressurized fluid and having openings arranged around the circumference of the window surface for directing flows of the pressurized fluid having an axially asymmetric flow pattern onto the window surface, generating an unstable flow pattern of the pressurized fluid on the window surface such that particles are removed from substantially all of the window surface.

2. The instrument of claim 1 wherein the purge means comprises ports disposed adjacent to the window surface for providing radial flow of the fluid onto the window surface.

3. The instrument of claim 2 wherein the port means are positioned radially around the window surface such that at least one port providing substantial flow is positioned so its central radial axis is non-coincidental with the central axis of other ports.

4. The instrument of claim 2 wherein the window surface has a central region disposed in the center of the window surface and spaced away from the ports and wherein the radial flow of the fluid is controlled to have an asymmetric magnitude such that there is substantial flow of fluid over the central region of the window surface.

5. The instrument of claim 4 wherein the radial flow has a low flow zone where generally opposite direction flows meet on the window surface and which zone moves with respect to the window surface.

6. The instrument of claim 4 wherein the radial flow has a low flow zone where generally opposite direction flows meet on the window surface and which zones moves with respect to the window surface.

7. An instrument for sensing radiation representative of a parameter in a particle suspension and for providing an output indicative of the parameter, the instrument receiving a supply of pressurized fluid, comprising:
   port means disposed on the instrument and opening to the parameter source for receiving the radiation;
   sensing means coupled to the port means for sensing the received radiation and for providing the output;
   window means disposed between the port means and the sensing means for transmitting the radiation therethrough and for shielding the sensing means from the particle suspension, the window means having a window surface for transmitting radiation to the sensing means exposed to the suspension; and
   purge means defining a plurality of radially spaced ports around the periphery of the window surface and means for providing a flow of the pressurized fluid inwardly from the ports toward center portions of the window surface, the ports being asymmetrical for providing an unstable flow of the pressurized fluid onto the window surface such that particles are removed from substantially all of the window surface.

8. The instrument of claim 7 wherein; the ports are separated by a plurality of walls and at least two of the walls having different annular length to provide the asymmetric flow.

9. The instrument of claim 7, and passageway means for the pressurized fluid formed to cause an abrupt change in direction of flow to inertially separate particles from the pressurized fluid prior to flow of the pressurized fluid through the ports.

* * * * *

UNITED STATES PATENT AND TRADEMARK OFFICE
CERTIFICATE OF CORRECTION

PATENT NO. : 4,836,689

DATED : June 6, 1989

INVENTOR(S) : Richard J. O'Brien et al.

It is certified that error appears in the above-identified patent and that said Letters Patent is hereby corrected as shown below:

Column 3, line 61, delete "member 25", and insert --member 35--.

Column 6, line 53, delete "unit 80", and insert --nut 80--.

Column 10, line 17, delete "zones" and insert --zone--.

Column 10, line 45, delete "pluraity" and insert --plurality--.

Signed and Sealed this

Twenty-eighth Day of November, 1989

Attest:

JEFFREY M. SAMUELS

Attesting Officer     Acting Commissioner of Patents and Trademarks